United States Patent
Maschwitz et al.

(10) Patent No.: US 6,444,945 B1
(45) Date of Patent: Sep. 3, 2002

(54) BIPOLAR PLASMA SOURCE, PLASMA SHEET SOURCE, AND EFFUSION CELL UTILIZING A BIPOLAR PLASMA SOURCE

(75) Inventors: Peter Maschwitz, Sebastopol, CA (US); Jaime Li, Martinsville, VA (US)

(73) Assignee: CP Films, Inc., Martinsville, VA (US)

( * ) Notice: Subject to any disclaimer, the term of this patent is extended or adjusted under 35 U.S.C. 154(b) by 0 days.

(21) Appl. No.: 09/818,680

(22) Filed: Mar. 28, 2001

(51) Int. Cl.[7] .............................................. B23K 10/00
(52) U.S. Cl. ......................... 219/121.54; 219/121.52; 219/121.36; 427/469; 118/723 E
(58) Field of Search ................ 219/121.54, 121.52, 219/121.57, 121.48, 121.47, 121.36; 427/569, 294, 248.1, 585, 595, 529; 313/632, 491; 118/723 E, 723 EB, 723 FE

(56) References Cited

U.S. PATENT DOCUMENTS

| | | | |
|---|---|---|---|
| 4,710,283 A | | 12/1987 | Singh et al. |
| 4,862,032 A | | 8/1989 | Kaufman et al. |
| 4,914,356 A | * | 4/1990 | Cockram ................... 315/307 |
| 5,217,761 A | | 6/1993 | Okada et al. |
| 5,336,326 A | | 8/1994 | Karner et al. |
| 5,359,258 A | | 10/1994 | Arkhipov et al. |
| 5,387,842 A | | 2/1995 | Roth et al. |
| 5,414,324 A | | 5/1995 | Roth et al. |
| 5,437,778 A | | 8/1995 | Hedgcoth |
| 5,457,298 A | | 10/1995 | Nelson et al. |
| 5,614,248 A | | 3/1997 | Schiller et al. |
| 5,614,273 A | * | 3/1997 | Goedicke et al. ........... 427/569 |
| 5,627,435 A | | 5/1997 | Jansen et al. |
| 5,716,500 A | | 2/1998 | Bardos et al. |
| 5,763,989 A | | 6/1998 | Kaufman |
| 5,846,608 A | * | 12/1998 | Neumann et al. ........... 427/529 |
| 5,882,492 A | * | 3/1999 | Manley et al. ......... 204/298.08 |

(List continued on next page.)

OTHER PUBLICATIONS

G. Musa, Institute of Physics and Technology of Radiation Devices, Bucharest, Romania; H. Ehrich and M. Mausbach, Institut fur Laser–und Plasmaphysik, Universitat Essen, Essen, Germany, Studies on Thermionic Cathode Anodic Vacuum Arcs, J. Vac. Sch. Techno. A 12(5), Sep./Oct. 1994, p. 2887.

S. Schiller et al., Progress in High–Rate Electron Beam Evaporation of Oxides for Web Coating, Society of Vacuurm Coaters, 36th Annual Technical Conference Proceedings (1993), Fraunhofer–Establishment for Electron Beam and Plasma Technology, Dresden, Germany, p. 278.

Andrew Shabalin et al., *Industrial Ion Sources and Their Applications for DLC Coating*, Advanced Energy Industries, Inc., Fort Collins, CO and Eugene Anoikin et al., HMT Technology Corporation, Fremont, Ca., p. 1.

Applied Ion Beam Group, Anode Layer Ion Sources, Ion Sources and Applications, Advanced Energy, Bloomfield Hills, Michigan.

*Primary Examiner*—Mark Paschall
(74) *Attorney, Agent, or Firm*—Bacon & Thomas

(57) ABSTRACT

A plasma source includes a structure made up of two hollow cathode shapes connected to a bipolar AC power supply. The bipolar power supply alternately drives one hollow cathode to a negative voltage while the opposite hollow cathode is driven to a positive voltage. As one of the two hollow cathode shapes is driven negative, the hollow cathode discharge forms within the corresponding cavity. The other cathode then forms an anode, causing electrons to escape the plasma and travel to the other side, completing the electric circuit. The plasma generator thus formed may be used as a heat source for an effusion cell to form a plasma from a reactant gas, or to increase the reactivity of gas situated between a vacuum deposition source and a substrate to be coated.

30 Claims, 2 Drawing Sheets

U.S. PATENT DOCUMENTS

| | | |
|---|---|---|
| 5,897,753 A | 4/1999 | Schatz et al. |
| 5,908,602 A | 6/1999 | Bardos et al. |
| 5,917,286 A | 6/1999 | Scholl et al. |
| 5,938,854 A | 8/1999 | Roth |
| 5,939,829 A * | 8/1999 | Schoenbach et al. ....... 313/623 |
| 5,944,967 A | 8/1999 | Kunz et al. |
| 5,969,470 A | 10/1999 | Druz et al. |
| 6,002,208 A | 12/1999 | Maishev et al. |
| 6,037,717 A | 3/2000 | Maishev et al. |
| 6,064,156 A | 5/2000 | Patterson et al. |
| 6,072,273 A | 6/2000 | Schoenbach et al. |
| 6,084,198 A | 7/2000 | Birx |

* cited by examiner

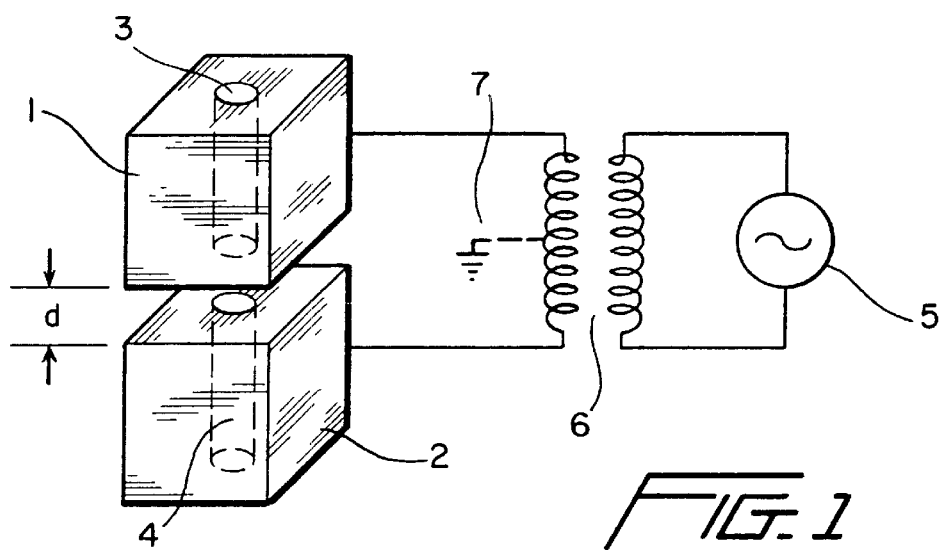
FIG. 1
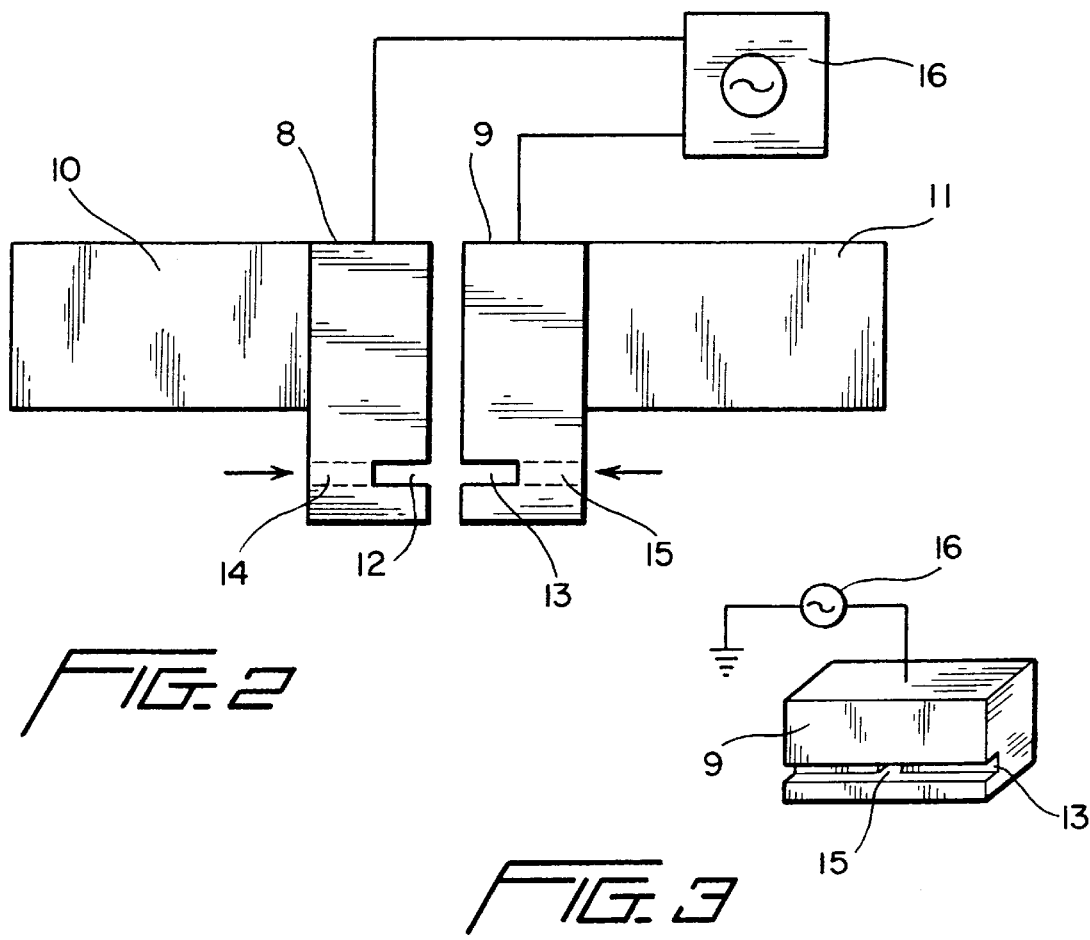
FIG. 2
FIG. 3

BIPOLAR PLASMA SOURCE, PLASMA SHEET SOURCE, AND EFFUSION CELL UTILIZING A BIPOLAR PLASMA SOURCE

BACKGROUND OF THE INVENTION

1. Field of the Invention

This invention generally relates to a plasma source, and in particular to a bipolar plasma source made up of two hollow cathodes to which is applied a bipolar AC signal for driving the hollow cathodes to mutually opposed positive and negative voltages in order to generate a uniform plasma.

The invention also relates to a method of generating plasmas by applying a bipolar AC signal to two hollow cathode structures in order to generate a uniform plasma.

Applications of the bipolar plasma source of the invention include (i) an effusion cell in which heat used to evaporate the evaporant material is directly or indirectly supplied by plasma generated within two opposed hollow cathodes powered by a bipolar power source, the hollow cathodes being situated in a lid of the effusion cell adjacent an exit through which vapor exits the effusion cell, and (ii) a plasma sheet source in which the plasma is generated by two opposed hollow cathode slots powered by a bipolar power source, the plasma being confined by magnetic field lines running parallel to the electric field lines, the plasma sheet source being suitable for use in energizing a gas situated between a vacuum deposition source and a substrate to be coated.

2. Description of Related Art

The present invention seeks to provide a more uniform and stable plasma, in order to enable use of the plasma as a heat or energy source in processes requiring even application of energy or heat over an extended area. Processes to which the plasma source and method of the invention may be applied include coating processes such as vacuum deposition, the plasmas being used as a heat source for an evaporant in an effusion cell and/or to apply energy to a gas situated between the vacuum deposition source and a substrate to be coated.

A. Background Concerning Hollow Cathode Plasma Generation

The present invention achieves the stable and uniform plasma necessary for applications requiring, for example, efficient heating of an evaporant in an effusion cell or uniform energization of a reactant, by using a modification of the conventional plasma generation method known as hollow cathode plasma generation. While uniform plasmas have been generated using closed drift ion sources having a closed path plasma shape, including sputtering magnetrons, such sources are bulky and not readily adaptable for use with conventional vacuum or sputter deposition apparatus. Conventional hollow cathode plasma devices, in contrast, are simple, compact, and efficient, but it has heretofore been impossible to generate a stable and uniform plasma over an extended linear dimension using a hollow cathode plasma generator, and thus use of hollow cathode plasma generators as heat or energy sources for coating processes has been limited.

A hollow cathode is simply a cavity in the form of an opening or slot in a conductive material. When a voltage is applied to the conductive material, the applied voltage will cause electrons in a gas present in the opening or slot to acquire energy from the applied voltage, eventually resulting in formation of a plasma.

Key parameters in the formation of plasmas include the material and pressure of the gas present in the opening or slot that forms the hollow cathode, the shape and dimensions of the opening or slot, and the material of the walls that define the opening or slot. In addition, the internal diameter of a cylindrically shaped opening or the width of the slot required to sustain a discharge depends on the gas pressure, so that the ideal cavity size for the plasma is inversely proportional to the pressure so that the higher the operating pressure the smaller the cavity. Common cavity diameters or slot widths are on the order of 1 mm to 3 mm at gas pressure in the range of $10^{-1}$ to $10^{-3}$ Torr although devices that operate from atmospheric pressure down to the $10^{-4}$ region have been proposed and are intended to be included within the scope of the present invention.

Depending on the above-described parameters, the plasmas formed in the opening or slot may be used in a wide variety of industrial applications, including applications based on the energy transfer involved in plasma formation for such surface treatment applications as cleaning, etching, and activation of compounds present in or on the surface, as well as deposition applications involving transfer of materials, which may include materials from the walls of the cathode, for transport to a surface. The constituents of the plasmas may be transported from the hollow cathode and accelerated through a nozzle by electric fields or other transport phenomena, or the plasmas may be allowed to lose energy shortly after formation through the recombination of electrons with ions.

While the hollow cathode plasma formation technique is well-known and has successfully been used for many years, it is difficult to use the hollow cathode plasma formation technique to form plasmas covering an extended area. In addition, the hollow cathode plasma formation technique has the disadvantage in some applications that the electrodes are subject to contamination by vapors.

The conventional method of generating plasmas covering an extended linear dimensions is to form an array multiple hollow cathodes in a common conductive structure to which cathode the voltage may be applied. Ideally, if the openings or slots are of uniform dimensions, then each cathode should simultaneously generate an identical amount and/or density of plasma, resulting in a relatively uniform formation of plasma over the extended area. However, even under ideal conditions, the hollow cathode array method of generating plasmas suffer from a number of problems:

First, the plasma formed by such an array cannot be completely uniform due to the discrete nature of the cathodes in the array.

Second, a problem arises in that unless the cathodes all light simultaneously, the ignition of some cathodes will cause a voltage drop in the area of other cathodes that may eventually prevent their ignition, making it very difficult in practice to get each hole to ignite uniformly.

Third, in any practical application, the walls of the cathodes will become contaminated, causing variations in the fields generated within the cathodes by applied voltages.

One way to counteract the inherently non-uniform nature of plasmas generated in discrete cathode arrays, and also the effects of differences in the electrical characteristics of the openings, including those resulting from contamination, is to use magnetic fields to cause the plasma to spread out more evenly following formation. The magnetic fields used for this purpose are in addition to any magnetic or electric fields used to manipulate or control the plasmas for a particular application following generation of the plasmas, however, and therefore add to the complexity of the device. In addition, it can be difficult to control over extended areas or beam lengths.

The present application avoids the problems of plasma instability and non-uniformity by utilizing a technique similar to that used to prevent accumulation of materials during sputter deposition, namely the use of two magnetrons to which an AC current is alternately applied, with the positive cycle of the AC current effectively discharging contaminants from the plasma source. In the case of sputter deposition, the technique involves the use of dual magnetrons or alternately energized cathodes, whereas the present invention involves the use of hollow cathodes.

It turns out that during hollow cathode plasma formation, the effect of applying an AC voltage to a pair of cathodes is not only to reduce the effect of contaminant formation in the cathodes (such as unintended arcing), but surprisingly also to increase the uniformity of the plasma over an extended linear area, permitting the formation of plasmas having an indefinite linear dimension. Even though each individual hollow cathode arranged in the manner to be described below may be identical to a conventional hollow cathode, the conventional hollow cathode, even when magnetic fields are added to enhance uniformity, cannot come close to generating plasmas as uniform over an extended distance as those obtained by the invention. Furthermore, in contrast to conventional hollow cathode arrangements, the present invention permits formation of both "normal" and thermionic plasmas, as will also be explained below, As indicated above, the stability and uniformity of plasmas is critical in many industrial applications, and thus numerous prior attempts have been made to improve the uniformity or linearity of plasmas. Background patents directed to improving the uniformity of plasmas created by hollow cathode techniques, or of generating plasmas over an extended area using arrays of hollow cathodes, include by way of example U.S. Pat. Nos. 5,908,602, 5,217,761, and 5,627,435, as well as in the publications entitled *High Density Plasma Sources* (Noyes Publications, pages 413–418) and "Multi-jet Hollow Cathode Discharge for Remote Polymer Deposition," in *Surface Coatings and Technology* (vol. 93, 1997, pages 128–133), while devices or techniques directed to improving the uniformity of ion beams, which are similar to plasmas but lack the free electrons, are disclosed in U.S. Pat. Nos. 6,002,208, 5,763, 989, 5,359,258, and 4,862,032, and sputter deposition arrangements using magnetrons are disclosed or discussed in U.S. Pat. Nos. 5,944,967 and 5,897,753. Additional background on hollow cathodes or plasma generation techniques in general are found in U.S. Pat. Nos. 6,064,156, 6,037,717, 5,969,470, 5,939,829, 5,938,854, 5,917,286, 5,457,298, 5,414,324, 5,437,778, 5,387,842, 5,241,243, 5,075,243, and 5,075,594.

None of the linear plasma or ion sources described in the above patents and literature results in the generation of a continuous plasma that is as uniform as that provided by the present invention, and yet most of the linear plasma or ion sources described there in are far more complex than that of the present invention, with the except of simple arrays of small plasma sources which, as discussed above, are non-continuous and have problems with achieving equal plasma intensities in all holes.

B. Background Concerning Plasma Sheet Generation

One application for the plasma generator of the invention is as an energy source for increasing the reactivity of a reactant gas such as oxygen or nitrogen used to form oxides or nitrides of silicon, titanium, or other metals emitted by a vacuum deposition source. Typically, in such coating processes, the reactive gas in introduced into the space between the metal source and the substrate. As the metal atoms impinge on the substrate, the reactive gas atoms are also present at the surface and a chemical reaction takes place to create a metal compound coating. The heat of the reaction is absorbed by the substrate atoms to allow the metal and reactant gas atoms to stay combined.

In order to enhance the reaction rate between the metal and the reactive gas and thereby ensure a fully oxidized or stoichiometric compound, the energy level or reactivity of the reactive gas may be raised by an order of magnitude or more if the gas is transformed into a plasma. The resulting disassociated forms of the reactive gas molecules, neutral gas atoms or molecule with electrons in higher orbits, and gas ions are all more reactive than the gas in its ground state, and the higher the ratio of these activated species to ground state gas atoms, the more reactive the plasma.

For large area sputtering or vacuum deposition, such as on polymer webs or glass, the uniformity of the deposited layer is usually critical. Required measurements of thickness, layer morphology, or layer oxidation state across the width of the substrate must often be held to less than ±2%. To meet these requirements in a plasma assisted process, not only must the deposition rate from the coating source be highly uniform, but so must the plasma density created by the plasma generation apparatus.

Achieving uniformity is made more difficult in this application not only because of the linear dimension of the sputtered or evaporated metal that must be combined with the reactant gas, but also the area. In the case of a plasma generator, the distance between the anode and cathode must be at least 10 cm wide. It is very difficult to achieve a uniform plasma over such an extended area using conventional apparatus. The bipolar plasma of the present invention, on the other hand, is ideally suited to providing the highly uniform plasma necessary to such a plasma-assisted coating process.

C. Background Concerning Effusion Source Heating

In addition to providing a continuous plasma source that can be applied to energize a reactive gas used in vacuum deposition, the invention can be used to provide an improved effusion source for the vapor flux used in the deposition, by utilizing a plasma rather than a resistive heat source to heat the evaporant in the plasma. In this application, the plasma serves to provide a more efficient heat source while reducing the size of the effusion source and increasing its reliability.

A conventional effusion source, also known as an effusion cell or a Knudsen cell, typically consists of a cylindrical container positioned in a vacuum chamber, a lid for the container having a hole smaller than the inside diameter of the cylinder, a material inside the container to be evaporated, and a resistive heat source to heat the evaporant material. When the evaporant material is heated to sufficient temperature, some of the evaporant changes state to the gas phase, which raises the pressure inside the cell to higher than the background vacuum pressure. The vapor in the cell at this time may be chemically the same as the evaporant, or disassociation may occur when the evaporant is a compound. In either case, due to the higher pressure in the cell, the vapor exits the lid hole and is directed at a substrate upon which the vapor condenses forming a coating. Generally, the whole cell must be heated as well as the evaporant. If a section of the hole is cooler than the vapor, condensation will occur at the hole which may consequently become plugged or partially plugged.

The shape of the effusion cell may be modified to suit the substrate which is being coated. For the purpose of coating polymer webs or other large substrates, the source may be an elongated rectangular box fitted with an elongated lid having a slot or a series of holes for the exiting vapor. The heat for vaporizing the evaporant material is supplied by resistively heated elements which may either be placed withing the crucible, formed by the lid itself as described in U.S. Pat. No. 5,902,634, positioned outside the crucible as described in U.S. Pat. No. 5,167,984, or in an attached secondary box as described in U.S. Pat. No. 4,401,052.

Each of the prior resistively heated effusion cell designs requires a high current, in the range of hundreds of amperes, to reach the high temperatures necessary to achieve a sufficient vaporization rate. As a result, parts of the heating apparatus other than the heating elements themselves must be water cooled. This results in the problems that it is difficult to achieve a uniform temperature, and that the water cooled parts to which the heating element is connected drain heat away from the heating elements. In addition, lids or other elements arranged to serve as resistors tend to be subject to breakage at high temperatures, necessitating immediate replacement of the resistive heating elements. The use of a bipolar plasma source significantly reduces each of these problems.

SUMMARY OF THE INVENTION

It is accordingly a first objective of the invention to provide a continuous, stable, and uniform plasma, and yet that is simple in construction.

It is a second objective of the invention to provide a continuous, uniform plasma over an extended linear dimension.

It is a third objective of the invention to provide a plasma source that provides improved uniformity without the need for magnetic fields to distribute the plasma more uniformly during formation.

It is a fourth objective of the invention to provide a plasma source for use as a heat source that, in comparison with a resistive heat source, does not require a bulky high current power supply and connectors.

It is a fifth objective of the invention to provide a plasma source having a relatively small profile, that can be retrofit in vacuum chambers where larger sources do not fit.

It is a sixth objective of the invention to provide a plasma source having improved resistance to arcing even when contaminated or dirty.

It is a seventh objective of the invention to provide a plasma source having a simple construction that can nevertheless be run in both normal mode and thermionic mode.

It is a eighth objective of the invention to provide a plasma source having a simple construction and yet that is more versatile than prior sources, and that can be used in many different configurations.

It is a ninth objective of the invention to provide a plasma source that provides uniform, stable, and quiet plasmas from a variety of gases that would otherwise contaminate the source, including SiO, TiO, and other oxides or nitrides such as are used in coating processes.

It is a tenth objective of the invention to provide various plasma generation applications which make use of a more uniform, continuous plasma generator, including:
A. a plasma sheet source suitable for uniformly energizing a reactive gas introduced between the vacuum deposition source and a substrate;
B. a plasma assisted reactive process utilizing the more uniform plasma sheet source; and
C. an effusion cell type evaporation source where the heat is derived from a plasma rather than a resistive heating effect.

These objectives are achieved, in accordance with the principles of a preferred embodiment of the invention, by providing a structure including first and second hollow cathode shapes to which is applied a bipolar alternating current output power supply (the term alternating current referring to any current that reverses polarity, including sine waves, square waves, or any other periodic or aperiodic alternating waveform). The bipolar power supply initially drives the first hollow cathode shape to a negative voltage, allowing plasma formation while the second hollow cathode shape is driven to a positive voltage in order to serve as an anode for the voltage application circuit, and then drives the first hollow cathode shape to a positive voltage, reversing the roles of cathode and anode.

The hollow cathode arrangement of the preferred embodiment of the invention may operate in either of two general modes, normal and thermionic. In normal mode, the hollow cathode temperature is kept low by water cooling or other cooling methods, and the cathode requires a few hundred to a few thousand volts to operate, with electron current remaining relatively low. In thermionic mode, the hollow cathode is allowed to rise in temperature from plasma heating effects or from a separate heating device, such that when the hollow cathode surface reaches very high temperatures, electron emission rises an order of magnitude higher than that of a cold cathode, resulting in a high cathode discharge current (e.g., 100 amps) at a relatively low voltage (e.g., tens of volts). The temperature required to reach thermionic mode and the electron current required is dependent on the work function of the material of the cathode.

The plasma source of the preferred embodiment of the invention may be used, without limitation, in any of a variety of applications in which stable and uniform plasmas are required. The present invention provides two specific examples of such applications.

The first example involves use of the hollow cathodes as a heater for an effusion cell used in vapor deposition. In this application, the hollow cathodes are placed on opposite edges of the slot through which vapor exits the cell, the plasma being used to directly or indirectly heat the vapor and/or the evaporant, either before or during exit of the vapor from the effusion cell.

The second example of an application for the plasma source of the invention is as a plasma sheet source which may be used to energize a reactant gas during a vacuum deposition coating process, or which may be formed from the reactant gas. The plasma sheet generator includes two approximately facing hollow cathodes powered by an AC power supply, as described above, which are situated between the vacuum deposition source and a substrate to be coated, and which transforms the reactant gas into a plasma to improve the reactivity of the gas so as improve the uniformity of the deposited compound.

According to an especially preferred implementation of the plasma sheet source, which may be used in application other than for the purpose of energizing a reactant in a coating process, a magnetic field parallel to the electric field between the hollow cathodes is used to restrict the electrons to a path between the hollow cathode shapes, thereby enabling establishment of a greater current between the shapes, and permitting the shapes to be positioned a greater distance apart. The magnetic fields may be planar, or the magnetic fields may be curved to permit use in applications where the hollow cathodes do not face each other.

BRIEF DESCRIPTION OF THE DRAWINGS

FIG. 1 is a schematic drawing of a bipolar plasma generator using cylindrically shaped hollow cathodes in accordance with the principles of a preferred embodiment of the invention.

FIG. 2 is a schematic view, shown in elevation from the side, of a specific implementation of the bipolar plasma generator illustrated in FIG. 1.

FIG. 3 is an isometric view of one of the two hollow cathode structures illustrated in FIG. 2.

DETAILED DESCRIPTION OF THE PREFERRED EMBODIMENTS

Figure 4:
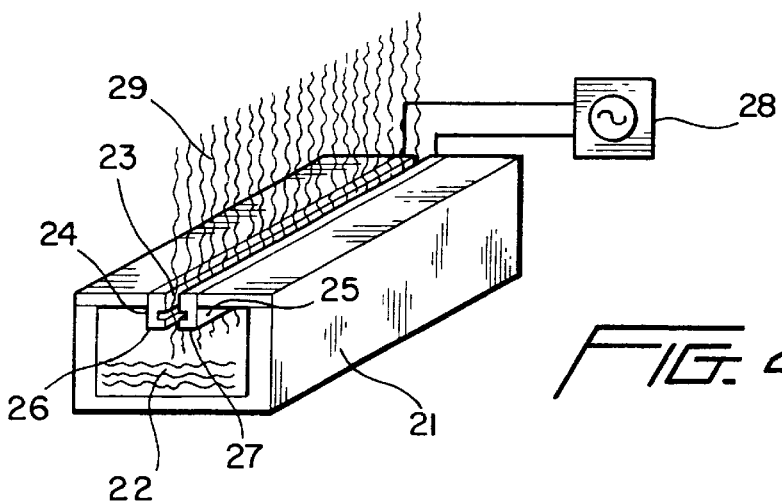
FIG. 4 is an isometric view, partially cut-away, of an effusion source which utilizes the plasma generator illustrated in FIGS. 2 and 3 as a source of heat for vapor passing through a slot at the top of the effusion source, and also for the evaporant.

FIG. 1 illustrates a dual hollow cathode plasma source arrangement constructed in accordance with the principles of a first preferred embodiment of the invention. The plasma source includes first and second hollow cathode structures 1,2, each of which includes a hollow cathode cavity 3,4. The exact dimensions and shapes of the individual cathode structures may be entirely conventional and the present invention is intended to apply to any hollow cathode structure connectable in the illustrated manner, although it is noted that the internal diameter of a cylindrically shaped opening or the width of the slot required to sustain a discharge depends on the gas pressure, so that the ideal cavity size for the plasma is inversely proportional to the pressure so that the higher the operating pressure the smaller the cavity, and that common cavity diameters or slot widths are on the order of 0.5 mm to 3 mm at gas pressure in the range of $10^0$ to $10^{-3}$ Torr.

The two hollow cathode structures 1,2 are electrically connected to an AC power source 5 which generates an AC current. An example of a frequency that has been found to generate a continuous uniform plasma is a frequency in the midfrequency range of 10 kHz to 500 kHz, such as 40 kHz, although much higher or lower frequencies may be used depending on the specific application to which the plasma generator of the invention is to be applied. While one of the cathode structures is subjected to a negative voltage, the other cathode will be subjected to a positive voltage, creating a voltage difference between the cathode structures and causing current to flow between the structures, completing the electric circuit. The second structure serves as an electron sink but is not subjected to a negative voltage which will cause generation of plasma therein. On the other hand, when the polarity of the applied voltages reverses due to the alternating nature of the voltage, the roles of cathode and anode are reversed, so that plasma is generated in the second cathode structure and the first hollow cathode structure serves as the anode.

In FIG. 1, the power source circuit further includes a transformer 6 with optional center tap 7, although it will be appreciated by those skilled in the art that the nature and details of the power supply circuitry may be varied in numerous ways without departing from the scope of the invention, which simply requires that the power supply be alternating in nature, that the frequency of the power supply be low enough to permit plasma formation by a substantially constant voltage, and that the power supply be connected between the two hollow cathode structures 1, 2 such that the power supply circuit is completed by free electrons traveling between the two oppositely charged hollow cathode structures. Although not limited to a specific frequency, a frequency of on the order of 40 kHz will work for many plasma applications and is the frequency used in the apparatus of the preferred embodiment of the invention.

In addition, it will be appreciated by those skilled in the art that, unlike a conventional hollow cathode array, in which surfaces other than the inside of the hole must be insulated from electrical discharge, the outer surfaces of the hollow cathodes of the invention may not need to be insulated from each other, although insulation may be used to prevent short circuits if the hollow cathodes are close to each other. Those skilled in the art will appreciate that the distance between the hollow cathodes must be greater than the dark space distance which, depending on the gas pressure, prevent formation of a plasma.

Finally, with respect to the preferred embodiment as illustrated in FIG. 1, it will be appreciated by the ordinary artisan that the apparatus depicted in FIG. 1 is depicted in a highly schematic manner and is not limited to a specific application, because the present invention is concerned solely with plasma generation and not with applications of the plasma generator. As mentioned above, following generation, the plasma may be caused to exit the generator through an appropriate nozzle, not shown, or may be permitted to remain within or adjacent the hollow cathode structures until it decays, i.e., until the plasma has lost energy and the free electrons have re-associated. All such applications are intended to be within the scope of the invention, and in addition, it is believed that many such applications will be within the capabilities of those skilled in the art of hollow cathode plasma generation, since the hollow cathode structures used in the preferred embodiment may be entirely conventional except for their arrangement in electrically associated pairs.

In the specific implementation of the preferred embodiment shown in FIGS. 2 and 3, the hollow cathodes structures are in the form of facing structures 8,9 (only one of which is shown in FIG. 3) surrounded by insulating blocks 10,11 made of a conductive material and having hollow cathode grooves 12,13 extending along the hollow cathode structures rather than cylindrical openings, thereby enabling generation of a continuous, linear, plasma of arbitrary length that is nevertheless surprisingly stable and uniform along the entire length for a variety of vapors.

In a manner similar to conventional hollow cathode arrangements, gas may either be fed into the grooves 12,13 through openings in the back of the grooves or from the space between the structures in which the grooves are formed, while the space between the structures may be open, the gas being supplied and pressurized by conventional equipment.

As in the m ore general embodiment illustrated in FIG. 1, each facing structure is connected to an AC power source 16 which generates an alternating current having a frequency low enough to alternately apply a voltage to each respective cathode structure for a sufficient time to generate a plasma within the structure.

According to an especially advantageous feature of the preferred embodiment of the invention, the hollow cathode arrangement of the preferred embodiment of the invention, as illustrated in any of FIGS. 1–3, may operate in either of two general modes, normal (i.e., non-thermionic) and thermionic. In normal mode, the hollow cathode temperature is kept low by water cooling or other cooling methods, and the cathode requires a few hundred to a few thousand volts to operate, with electron current remaining relatively low, in the few amp range. In thermionic mode, the hollow cathode is allowed to rise in temperature from plasma heating effects or from a separate heating device until the hollow cathode surface reaches a temperature at which electron emission rises to at least an order of magnitude higher than that of a cold cathode, resulting in a cathode discharge in the tens of volts range and current as high as 100 amps to the anode. The temperature required to reach thermionic mode and the electron current required is dependent on the work function of the material of the cathode.

The method of the invention simply involves applying an alternating current to two hollow cathode structures such that one of the cathode structures generates a plasma while the other structure serves as an anode to complete the power supply circuit. The specific steps of the preferred method are (i) to provide two hollow cathode structures arranged such that free electrons can pass between the structures when a differential voltage is applied to the structures, and (ii) to apply the differential voltage to the structures by applying an alternating current to the structures in such a manner that the power supply initially drives the first hollow cathode shape to a negative voltage, allowing plasma formation while the second hollow cathode shape is driven to a positive voltage in order to serve as an anode for the voltage application circuit, and then drives the first hollow cathode shape to a positive voltage, reversing the roles of plasma generator and anode, the frequency of the applied AC signal or pulse is sufficiently low to maintain a constant or slowly changing negative voltage in the first (or second) hollow cathode shape for a sufficient period to generate the plasma.

An effusion cell which utilizes the plasma generator of the invention is illustrated in FIG. 4. The effusion cell of FIG. 4 is in the form of an elongated crucible 21 containing an evaporant 22. The lid of the crucible includes a slot 23 along the edges of which are positioned two hollow cathode structures 24 and 25 corresponding to hollow cathodes structures 8 and 9 illustrated in FIGS. 2 and 3, each cathode structure having formed therein a respective hollow cathode groove 26,27. The lid serves as an electrical insulator, while the cathode structures are electrically connected to an alternating current source 28.

When power is applied to the hollow cathode structures in the presence of a background gas, the background gas in the hollow cathode structures is transformed into a plasma, which in turn heats the hollow cathode structures and at least the slot through which vapor 29 is emitted when pressure inside the crucible increases upon heating of the evaporant 21. The hollow cathode structures may thus be arranged to either heat the interior of the crucible, vaporizing the contents, and/or to supply heat to the vapor emitted from through the slot 23, preventing condensation of the vapor as it exits the slot and increasing the energy of or, depending on the gas pressure and the width of the slot, ionizing the vapor so as to increase the uniformity of the resulting coating.

Figure 5:
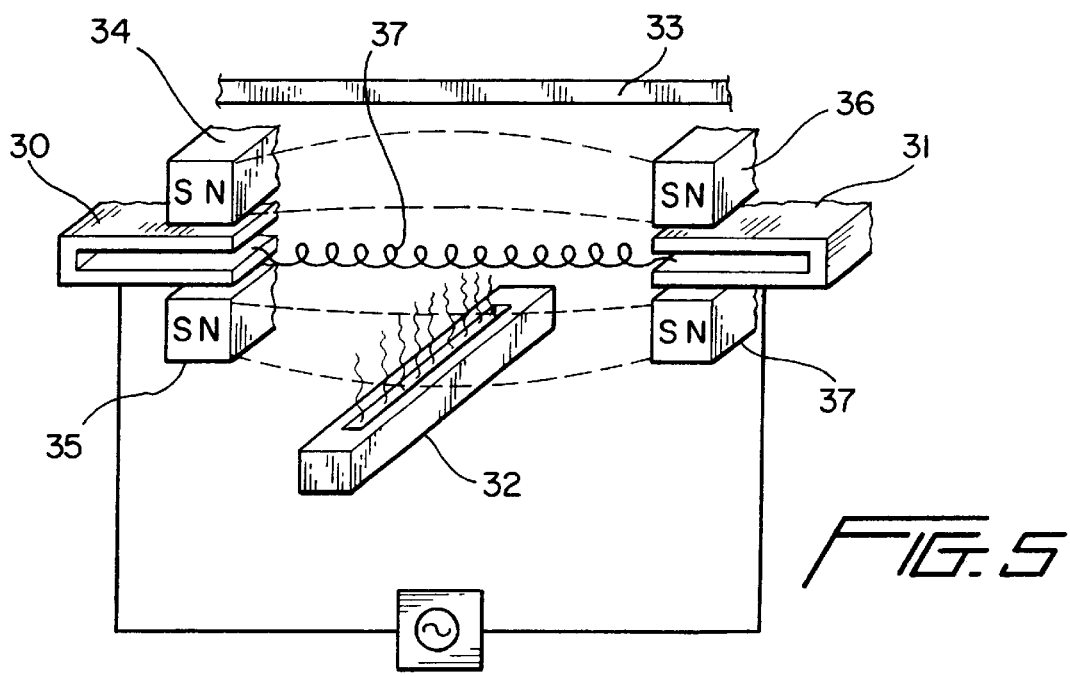
FIG. 5 is a schematic drawing of a plasma sheet source which utilizes the plasma generator illustrated in FIGS. 2 and 3 to generate a plasma that is uniform over a planar area.

The plasma sheet source of the application illustrated in FIG. 5 also includes two facing hollow cathode structures 30,31, but the hollow cathode structures are positioned between a vacuum deposition source 32 and a substrate 33 to be coated. The vacuum deposition source 32 may be a source corresponding to the effusion source illustrated in FIG. 4, but is not limited to such a plasma-heated source. In this application, the hollow cathode structures are arranged to generate a plasma in a gas which is to be combined with emissions from the source to form a coating on the substrate.

Because the emissions from the source 32 will spread out as they travel towards the substrate, the hollow cathodes are positioned further apart than in the example illustrated in FIG. 3. In particular, the hollow cathodes may be positioned anywhere from a few centimeters apart to 10 centimeters or greater.

In order to restrict the electron path between the hollow cathodes to a straight line directly between the hollow cathode shapes, a magnetic field is established parallel to the electron path, by magnets 34,35,36,37 having complementary facing poles extending along the edges of the cathode slots. Magnets 34,35,36,37 may either be permanent magnets or electro-magnetics and are arranged so as to provide a uniform magnetic field.

With the magnetic field in place, a greater current can be established between the cathode shapes, and consequently the plasma contains a higher ratio of energized species to ground state gas atoms or molecules. The higher the magnetic field between the cathode shapes, the greater the distance that may be established between the shapes.

In addition to enabling the hollow cathode structures 30,31 to positioned a relatively large distance apart, the magnetics field also has the advantage of causing the electrons to travel in a confined path within the parallel electric and magnetic fields. The confined path increases the chance of collisions between electrons and gas molecules, further improving the ratio of energized species.

In a variation of the plasma sheet generator illustrated in FIG. 5, the magnets may be used to cause the electrons to follow a curve between the hollow cathode structures. In this variation, illustrated in FIG. 6, the hollow cathodes 38,39 and surrounding magnets 40,41,42,43 are oriented at some angle to each other, resulting in a curved magnetic field that confines the electrons to a path between the magnetic fields, with the base 45 optionally forming a return path for the magnetic flux generated by the respective magnets.

Figure 6:
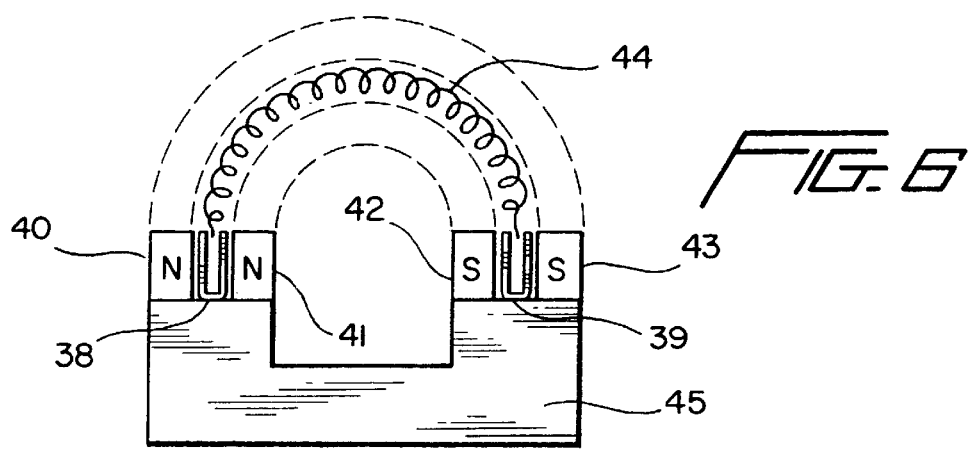
FIG. 6 is a schematic drawing of a variation of the plasma sheet source of FIG. 5, in which the electron path between the hollow cathodes structures is curved.

In both the embodiments of FIGS. 5 and 6, it may be necessary to water cool the magnets, as well as the hollow cathodes, but the bulk of the water cooling arrangement should not be a problem since the plasma generator is not required to fit into a standard effusion cell, and since the plasma generator is not being used as a heater.

Having thus described a preferred embodiment of the invention in sufficient detail to enable those skilled in the art to make and use the invention, it will nevertheless be appreciated that numerous variations and modifications of the illustrated embodiment may be made without departing from the spirit of the invention, and it is intended that the invention not be limited by the above description or accompanying drawings, but that it be defined solely in accordance with the appended claims.

We claim:

1. A plasma source, comprising:
   a first hollow cathode structure and a second hollow cathode structure;
   an AC power source connected to each of said hollow cathode structures and arranged to apply a negative voltage to a respective one of said hollow cathode structures that is sufficiently negative relative to a voltage of the other of said hollow cathode structures to cause plasma generation, said negative voltage being alternatingly applied to each of the hollow cathode structures,
   wherein said AC power source is arranged such that, when said negative voltage is applied to the first hollow cathode structure and a plasma is generated therein, the second of the hollow cathode structures serves as an anode to attract electrons from the first of the two hollow cathode structures and thereby complete an electrical circuit with the power source, and wherein when a polarity of voltage applied to the first hollow cathode structure reverses, another plasma is generated in said second hollow cathode structure, and the first hollow cathode structure serves as an anode to attract electrons from the second hollow plasma structure and thereby again complete the electrical circuit with the power source.

2. A plasma source as claimed in claim 1, wherein said hollow cathode structures are in the form of conductive structures having symmetric cylindrical openings formed therein, said cylindrical openings facing each other.

3. A plasma source as claimed in claim 1, wherein said hollow cathode structures are in the form of grooves extending along facing surfaces of the hollow cathode structures.

4. A plasma source as claimed in claim 1, wherein said AC power source is a mid-frequency generator having a mid-frequency output of on the order of 10 kHz to 500 kHz.

5. A plasma source as claimed in claim 1, said plasma is in the form of a hollow cathode-type plasma discharge.

6. A plasma source as claimed in claim 1, wherein said hollow cathode structures are free of insulation.

7. A plasma source as claimed in claim 1, wherein said plasma source serves as a heat source.

8. A plasma source as claimed in claim 7, wherein said first and second hollow cathode structures are positioned on opposite sides of an exit in a lid of an effusion source, said plasma source thereby serving to provide heat, vaporize the evaporant material and provide ionization to increase a reactivity of vapors from said effusion source.

9. A plasma source as claimed in claim 1, wherein said plasma source is positioned between a vacuum deposition source and substrate, and arranged to form a transform a gas into a plasma to increase a reactivity of the gas.

10. A plasma source as claimed in claim 9, wherein said first and second hollow cathode structures include exits or slots defining a volume extending therebetween, and further comprising magnets arranged to create magnetic fields parallel to a path of electrons between said exits or slots, and whereby said electrons are confined to paths within said volume between said magnets.

11. A plasma source as claimed in claim 1, wherein said first and second hollow cathode structures include exits or slots, and further comprising magnets arranged to create magnetic fields parallel to a path of electrons between said exits or slots, and whereby said electrons are confined to paths between said magnets.

12. A plasma source as claimed in claim 11, wherein said paths are confined to a line or plane extending between said exits or slots.

13. A plasma source as claimed in claim 11, wherein said paths follow a curve extending between said hollow cathode structures and defined by said magnetic fields.

14. A method of generating a plasma, comprising the steps of:

providing first and second hollow cathode structures arranged such that free electrons can pass between the structures when a differential voltage is applied to the structures, and applying the differential voltage to the first and second hollow cathode structures by applying an alternating current to the hollow cathode structures in such a manner that the power supply initially drives the first hollow cathode shape to a negative voltage, allowing plasma formation while the second hollow cathode shape is driven to a positive voltage in order to serve as an anode for the voltage application circuit, and then drives the first hollow cathode shape to a positive voltage, reversing the roles of plasma generator and anode.

15. A method as claimed in claim 14, wherein said AC power source is a generator having a midfrequency output of on the order of 10 kHz to 500 kHz.

16. A method as claimed in claim 14, wherein said step of applying a voltage and generating a plasma is carried out in normal mode while maintaining said hollow cathode structures cold enough not to cause thermionic emission.

17. A method of claimed in claim 14, wherein said step of applying a voltage and generating a plasma is carried out in thermionic mode while heating respective said first and second hollow cathode structures.

18. A method as claimed in claim 14, wherein said step of applying a voltage and generating a plasma is carried out between hollow cathode structures positioned adjacent an exit of an effusion source, said plasma serving to heat and/or increase the reactivity of vapors from said effusion source.

19. A method as claimed in claim 14, further comprising the step of generating magnetic fields adjacent and parallel to a path of electrons between said hollow cathode structures to thereby confine said electrons to paths extending between said hollow cathode structures.

20. An effusion source, comprising:

an effusion cell having a lid, said lid having an exit through which vapor exits the effusion source;

a plasma generator arranged in said lid adjacent said exit, said plasma generator serving as a heat source for said effusion cell.

21. An effusion source as claimed in claim 20, wherein said plasma generator comprises:

a first hollow cathode structure extending along one side of said exit and a second hollow cathode structure extending along an opposite side of said exit;

an AC power source connected to each of said hollow cathode structures such that a negative voltage sufficient to cause plasma generation is alternatingly applied to each of the hollow cathode structures, wherein said AC power source is arranged such that, when said negative voltage is applied to the first hollow cathode structure and a plasma is generated therein, the second of the hollow cathode structures serves as an anode to attract electrons from the first of the two hollow cathode structures and thereby complete an electrical circuit with the power source, wherein when a polarity of voltage applied to the first hollow cathode structure reverses, another plasma is generated in said second hollow cathode structure, and the first hollow cathode structure serves as an anode to attract electrons from the second hollow plasma structure and thereby again complete the electrical circuit with the power source, and wherein said plasma serves as a heat source for vapor exiting through said exit.

22. An effusion source as claimed in claim 21, wherein said hollow cathode structures are in the form of grooves extending along facing surfaces of the hollow cathode structures.

23. An effusion source as claimed in claim 21, wherein said AC power source is a mid-frequency generator having a midfrequency output of on the order of 10 kHz to 500 kHz.

24. An effusion source as claimed in claim 20, wherein said plasma serves as a heat source for an evaporant in said cell.

25. An effusion source as claimed in claim 20, wherein said plasma serves as a heat source for structures which transfer said heat to said evaporant and ionize said evaporant to increase the reactivity of said evaporant.

26. A plasma sheet source, comprising:
   a first hollow cathode structure including a first groove and a second hollow cathode structure including a second groove facing and parallel to said first groove;
   an AC power source connected to each of said hollow cathode structures such that a negative voltage sufficient to cause plasma generation is alternatingly applied to each of the hollow cathode structures; and
   a magnetic structure on each side of each of said grooves,
   wherein said AC power source is arranged such that, when said negative voltage is applied to the first hollow cathode structure and a plasma is generated therein, the second of the hollow cathode structures serves as an anode to attract electrons from the first of the two hollow cathode structures and thereby complete an electrical circuit with the power source,
   wherein when a polarity of voltage applied to the first hollow cathode structure reverses, another plasma is generated in said second hollow cathode structure, and the first hollow cathode structure serves as an anode to attract electrons from the second hollow plasma structure and thereby again complete the electrical circuit with the power source, and
   wherein said magnetic structures generate a magnetic field that confines said electrons to paths extending between said grooves.

27. A plasma sheet source as claimed in claim 26, wherein said AC power source is a mid-frequency generator having a midfrequency output of on the order of 10 kHz to 500 kHz.

28. A plasma sheet source as claimed in claim 26, wherein said paths are confined to a plane extending between said slots.

29. A plasma sheet source as claimed in claim 26, wherein said paths follow a curve extending between said hollow cathode structures and defined by said magnetic fields.

30. A plasma sheet source as claimed in claim 26, wherein said plasma sheet source is positioned between a vacuum deposition source and substrate, and arranged to transform a gas into a plasma to increase a reactivity of the gas.

* * * * *